United States Patent
Ramprasad et al.

(10) Patent No.: US 12,081,229 B2
(45) Date of Patent: Sep. 3, 2024

(54) COMMON-MODE CURRENT REMOVAL SCHEMES FOR DIGITAL-TO-ANALOG CONVERTERS

(71) Applicant: QUALCOMM Incorporated, San Diego, CA (US)

(72) Inventors: Sumant Ramprasad, Cupertino, CA (US); Nitz Saputra, Burlingame, CA (US); Ashok Swaminathan, Cardiff, CA (US)

(73) Assignee: QUALCOMM Incorporated, San Diego, CA (US)

( * ) Notice: Subject to any disclaimer, the term of this patent is extended or adjusted under 35 U.S.C. 154(b) by 156 days.

(21) Appl. No.: 17/811,706

(22) Filed: Jul. 11, 2022

(65) Prior Publication Data

US 2024/0014824 A1    Jan. 11, 2024

(51) Int. Cl.
   *H03M 1/08*      (2006.01)
   *H03M 1/74*      (2006.01)
   *H03M 1/78*      (2006.01)

(52) U.S. Cl.
   CPC ............. *H03M 1/08* (2013.01); *H03M 1/742* (2013.01); *H03M 1/785* (2013.01)

(58) Field of Classification Search
   CPC ......... H03M 1/08; H03M 1/742; H03M 1/785
   USPC .......................................... 341/134, 144–145
   See application file for complete search history.

(56) References Cited

U.S. PATENT DOCUMENTS

| | | | |
|---|---|---|---|
| 7,903,013 B2* | 3/2011 | Yamaguchi | H03M 1/0643 341/145 |
| 8,421,662 B2* | 4/2013 | Kon | H03M 1/687 341/145 |
| 9,819,357 B1* | 11/2017 | Guo | H03M 1/0607 |
| 2012/0050085 A1 | 3/2012 | Kon | |
| 2020/0099389 A1 | 3/2020 | Sung et al. | |
| 2021/0391871 A1 | 12/2021 | Liu et al. | |

FOREIGN PATENT DOCUMENTS

WO    2018208428 A1    11/2018

OTHER PUBLICATIONS

International Search Report and Written Opinion—PCT/US2023/067841—ISA/EPO—Sep. 29, 2023.

* cited by examiner

*Primary Examiner* — Khai M Nguyen
(74) *Attorney, Agent, or Firm* — Patterson & Sheridan LLP

(57) ABSTRACT

Methods and apparatus for common-mode current removal in a digital-to-analog converter (DAC). An example DAC circuit generally includes a plurality of current-steering cells, a resistor ladder circuit coupled to the plurality of current-steering cells and having a plurality of shunt branches, and an adjustable resistance circuit coupled between middle nodes of the plurality of shunt branches and a reference potential node for the DAC circuit.

26 Claims, 13 Drawing Sheets

600

OPERATE A DIGITAL-TO-ANALOG CONVERTER (DAC) CIRCUIT COMPRISING A PLURALITY OF CURRENT-STEERING CELLS AND A RESISTOR LADDER CIRCUIT COUPLED TO THE PLURALITY OF CURRENT-STEERING CELLS AND HAVING A PLURALITY OF SHUNT BRANCHES

602

CONTROL AN ADJUSTABLE RESISTANCE CIRCUIT COUPLED BETWEEN MIDDLE NODES OF THE PLURALITY OF SHUNT BRANCHES AND A REFERENCE POTENTIAL NODE FOR THE DAC CIRCUIT, TO SINK AT LEAST A PORTION OF A COMMON-MODE CURRENT OF THE DAC CIRCUIT FROM THE SHUNT BRANCHES OF THE RESISTOR LADDER CIRCUIT

FIG. 6

OPERATE A DIGITAL-TO-ANALOG CONVERTER (DAC) CIRCUIT COMPRISING A PLURALITY OF CURRENT-STEERING CELLS AND A RESISTOR LADDER CIRCUIT COUPLED TO THE PLURALITY OF CURRENT-STEERING CELLS AND HAVING A PLURALITY OF SHUNT BRANCHES

CONTROL A PLURALITY OF SWITCHES, EACH SWITCH BEING COUPLED BETWEEN A MIDDLE NODE OF ONE OF THE PLURALITY OF SHUNT BRANCHES AND A REFERENCE POTENTIAL NODE FOR THE DAC CIRCUIT, TO SELECTIVELY SINK PORTIONS OF A COMMON-MODE CURRENT OF THE DAC CIRCUIT FROM THE SHUNT BRANCHES OF THE RESISTOR LADDER CIRCUIT

FIG. 7

COMMON-MODE CURRENT REMOVAL SCHEMES FOR DIGITAL-TO-ANALOG CONVERTERS

TECHNICAL FIELD

Certain aspects of the present disclosure generally relate to electronic circuits and, more particularly, to techniques and apparatus for common-mode current removal in a digital-to-analog converter (DAC).

BACKGROUND

Wireless communication devices are widely deployed to provide various communication services such as telephony, video, data, messaging, broadcasts, and so on. Such wireless communication devices may transmit and/or receive radio frequency (RF) signals via any of various suitable radio access technologies (RATs) including, but not limited to, 5G New Radio (NR), Long Term Evolution (LTE), Code Division Multiple Access (CDMA), Time Division Multiple Access (TDMA), Wideband CDMA (WCDMA), Global System for Mobility (GSM), Bluetooth, Bluetooth Low Energy (BLE), ZigBee, wireless local area network (WLAN) RATs (e.g., WiFi), and the like.

A wireless communication network may include a number of base stations that can support communication for a number of mobile stations. A mobile station (MS) may communicate with a base station (BS) via a downlink and an uplink. The downlink (or forward link) refers to the communication link from the base station to the mobile station, and the uplink (or reverse link) refers to the communication link from the mobile station to the base station. A base station may transmit data and control information on the downlink to a mobile station and/or may receive data and control information on the uplink from the mobile station. The base station and/or mobile station may include a transmission digital-to-analog converter (TX DAC), which may be used, for example, to convert a digital signal to an analog signal for signal processing (e.g., filtering, upconverting, and amplifying) before transmission by one or more antennas.

SUMMARY

The systems, methods, and devices of the disclosure each have several aspects, no single one of which is solely responsible for its desirable attributes. Without limiting the scope of this disclosure as expressed by the claims which follow, some features will now be discussed briefly. After considering this discussion, and particularly after reading the section entitled "Detailed Description," one will understand how the features of this disclosure provide advantages that include increased voltage headroom, smaller area, lower common-mode current variation with changes in process, voltage, and/or temperature (PVT), and improved differential and common-mode noise performance in a current-steering digital-to-analog converter (DAC).

Certain aspects of the present disclosure provide a DAC. The DAC generally includes a plurality of current-steering cells, a resistor ladder circuit coupled to the plurality of current-steering cells and having a plurality of shunt branches, and an adjustable resistance circuit coupled between middle nodes of the plurality of shunt branches and a reference potential node for the DAC circuit.

Certain aspects of the present disclosure provide a DAC. The DAC generally includes a plurality of current-steering cells, a resistor ladder circuit coupled to the plurality of current-steering cells and having a plurality of shunt branches, and a plurality of switches, each switch being coupled between a middle node of one of the plurality of shunt branches and a reference potential node for the DAC circuit.

Certain aspects of the present disclosure provide a method of operating a DAC. The DAC generally includes a plurality of current-steering cells and a resistor ladder circuit coupled to the plurality of current-steering cells and having a plurality of shunt branches. The method generally involves controlling an adjustable resistance circuit coupled between middle nodes of the plurality of shunt branches and a reference potential node for the DAC circuit, to sink at least a portion of a common-mode current of the DAC circuit from the shunt branches of the resistor ladder circuit.

Certain aspects of the present disclosure provide a method of operating a DAC. The DAC generally includes a plurality of current-steering cells and a resistor ladder circuit coupled to the plurality of current-steering cells and having a plurality of shunt branches. The method generally involves controlling a plurality of switches, each switch being coupled between a middle node of one of the plurality of shunt branches and a reference potential node for the DAC circuit, to selectively sink portions of a common-mode current of the DAC circuit from the shunt branches of the resistor ladder circuit.

To the accomplishment of the foregoing and related ends, the one or more aspects comprise the features hereinafter fully described and particularly pointed out in the claims. The following description and the annexed drawings set forth in detail certain illustrative features of the one or more aspects. These features are indicative, however, of but a few of the various ways in which the principles of various aspects may be employed, and this description is intended to include all such aspects and their equivalents.

BRIEF DESCRIPTION OF THE DRAWINGS

So that the manner in which the above-recited features of the present disclosure can be understood in detail, a more particular description, briefly summarized above, may be had by reference to aspects, some of which are illustrated in the appended drawings. It is to be noted, however, that the appended drawings illustrate only certain typical aspects of this disclosure and are therefore not to be considered limiting of its scope, for the description may admit to other equally effective aspects.

FIGS. 6 and 7 are flow diagrams of example operations for digital-to-analog conversion with common-mode current removal, in accordance with certain aspects of the present disclosure.

To facilitate understanding, identical reference numerals have been used, where possible, to designate identical elements that are common to the figures. It is contemplated that elements disclosed in one aspect may be beneficially utilized on other aspects without specific recitation.

DETAILED DESCRIPTION

Figure 1:
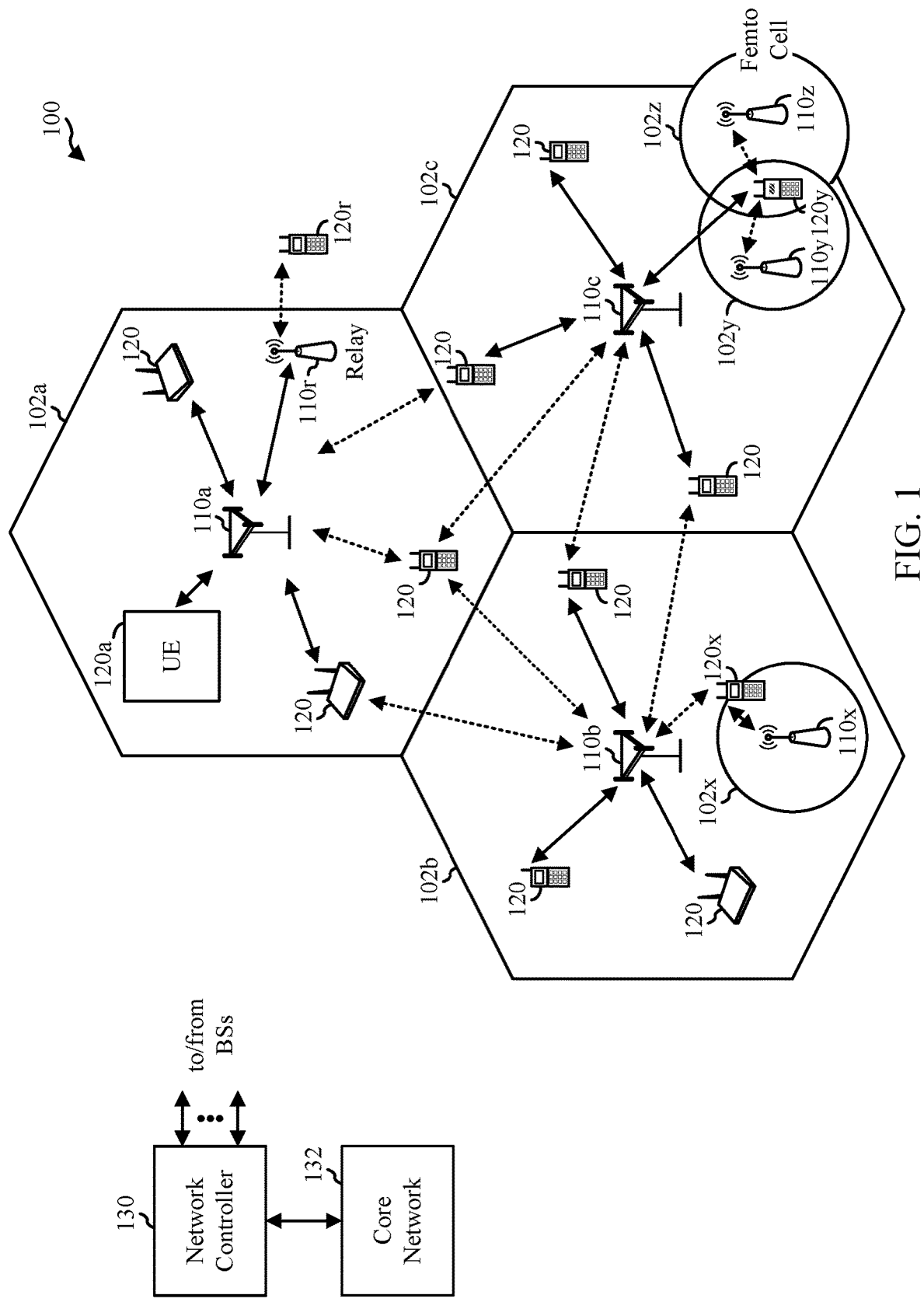
FIG. 1 is a diagram of an example wireless communications network, in which aspects of the present disclosure may be practiced.

Certain aspects of the present disclosure relate to techniques and apparatus for common-mode current removal in a digital-to-analog converter (DAC), such as a current-steering DAC with a plurality of current-steering cells and a resistor ladder circuit having a plurality of shunt branches. For certain aspects, common-mode current removal may be implemented with an adjustable resistance circuit coupled between middle nodes of the plurality of shunt branches and a reference potential node for the DAC. The adjustable resistance circuit may be designed to remove (or at least substantially reduce) the common-mode current from the DAC. For other aspects, common-mode current removal may be accomplished by a plurality of switches, where each switch is coupled between a middle node of one of the plurality of shunt branches and the reference potential node for the DAC. Yet other aspects may use a hybrid approach, combining the common-mode current removal schemes described herein.

Various aspects of the disclosure are described more fully hereinafter with reference to the accompanying drawings. This disclosure may, however, be embodied in many different forms and should not be construed as limited to any specific structure or function presented throughout this disclosure. Rather, these aspects are provided so that this disclosure will be thorough and complete, and will fully convey the scope of the disclosure to those skilled in the art. Based on the teachings herein one skilled in the art should appreciate that the scope of the disclosure is intended to cover any aspect of the disclosure disclosed herein, whether implemented independently of or combined with any other aspect of the disclosure. For example, an apparatus may be implemented or a method may be practiced using any number of the aspects set forth herein. In addition, the scope of the disclosure is intended to cover such an apparatus or method which is practiced using other structure, functionality, or structure and functionality in addition to or other than the various aspects of the disclosure set forth herein. It should be understood that any aspect of the disclosure disclosed herein may be embodied by one or more elements of a claim.

The word "exemplary" is used herein to mean "serving as an example, instance, or illustration." Any aspect described herein as "exemplary" is not necessarily to be construed as preferred or advantageous over other aspects.

As used herein, the term "connected with" in the various tenses of the verb "connect" may mean that element A is directly connected to element B or that other elements may be connected between elements A and B (i.e., that element A is indirectly connected with element B). In the case of electrical components, the term "connected with" may also be used herein to mean that a wire, trace, or other electrically conductive material is used to electrically connect elements A and B (and any components electrically connected therebetween).

An Example Wireless System

FIG. 1 illustrates an example wireless communications network 100, in which aspects of the present disclosure may be practiced. For example, the wireless communications network 100 may be a New Radio (NR) system (e.g., a Fifth Generation (5G) NR network), an Evolved Universal Terrestrial Radio Access (E-UTRA) system (e.g., a Fourth Generation (4G) network), a Universal Mobile Telecommunications System (UMTS) (e.g., a Second Generation/Third Generation (2G/3G) network), or a code division multiple access (CDMA) system (e.g., a 2G/3G network), or may be configured for communications according to an IEEE standard such as one or more of the 802.11 standards, etc.

As illustrated in FIG. 1, the wireless communications network 100 may include a number of base stations (BSs) 110a-z (each also individually referred to herein as "BS 110" or collectively as "BSs 110") and other network entities. A BS may also be referred to as an access point (AP), an evolved Node B (eNodeB or eNB), a next generation Node B (gNodeB or gNB), or some other terminology.

A BS 110 may provide communication coverage for a particular geographic area, sometimes referred to as a "cell," which may be stationary or may move according to the location of a mobile BS. In some examples, the BSs 110 may be interconnected to one another and/or to one or more other BSs or network nodes (not shown) in wireless communications network 100 through various types of backhaul interfaces (e.g., a direct physical connection, a wireless connection, a virtual network, or the like) using any suitable transport network. In the example shown in FIG. 1, the BSs 110a, 110b, and 110c may be macro BSs for the macro cells 102a, 102b, and 102c, respectively. The BS 110x may be a pico BS for a pico cell 102x. The BSs 110y and 110z may be femto BSs for the femto cells 102y and 102z, respectively. ABS may support one or multiple cells.

The BSs 110 communicate with one or more user equipments (UEs) 120a-y (each also individually referred to herein as "UE 120" or collectively as "UEs 120") in the wireless communications network 100. A UE may be fixed or mobile and may also be referred to as a user terminal (UT), a mobile station (MS), an access terminal, a station (STA), a client, a wireless device, a mobile device, or some other terminology. A user terminal may be a wireless device, such as a cellular phone, a smartphone, a personal digital assistant (PDA), a handheld device, a wearable device, a wireless modem, a laptop computer, a tablet, a personal computer, etc.

The BSs 110 are considered transmitting entities for the downlink and receiving entities for the uplink. The UEs 120 are considered transmitting entities for the uplink and receiving entities for the downlink. As used herein, a "transmitting entity" is an independently operated apparatus or device capable of transmitting data via a frequency channel, and a "receiving entity" is an independently operated apparatus or device capable of receiving data via a frequency channel. In the following description, the subscript "dn" denotes the downlink, the subscript "up" denotes the uplink. $N_{up}$ UEs may be selected for simultaneous transmission on the uplink, $N_{dn}$ UEs may be selected for simultaneous transmission on the downlink. $N_{up}$ may or may not be equal to $N_{dn}$, and $N_{up}$ and $N_{dn}$ may be static values or can change for each scheduling interval. Beam-steering or some other spatial processing technique may be used at the BSs 110 and/or UEs 120.

The UEs 120 (e.g., 120x, 120y, etc.) may be dispersed throughout the wireless communications network 100, and each UE 120 may be stationary or mobile. The wireless communications network 100 may also include relay stations (e.g., relay station 110r), also referred to as relays or the like, that receive a transmission of data and/or other information from an upstream station (e.g., a BS 110a or a UE 120r) and send a transmission of the data and/or other information to a downstream station (e.g., a UE 120 or a BS 110), or that relays transmissions between UEs 120, to facilitate communication between devices.

The BSs 110 may communicate with one or more UEs 120 at any given moment on the downlink and uplink. The downlink (i.e., forward link) is the communication link from the BSs 110 to the UEs 120, and the uplink (i.e., reverse link) is the communication link from the UEs 120 to the BSs 110. A UE 120 may also communicate peer-to-peer with another UE 120.

The wireless communications network 100 may use multiple transmit and multiple receive antennas for data transmission on the downlink and uplink. BSs 110 may be equipped with a number $N_{ap}$ of antennas to achieve transmit diversity for downlink transmissions and/or receive diversity for uplink transmissions. A set $N_u$ of UEs 120 may receive downlink transmissions and transmit uplink transmissions. Each UE 120 may transmit user-specific data to and/or receive user-specific data from the BSs 110. In general, each UE 120 may be equipped with one or multiple antennas. The $N_u$ UEs 120 can have the same or different numbers of antennas.

The wireless communications network 100 may be a time division duplex (TDD) system or a frequency division duplex (FDD) system. For a TDD system, the downlink and uplink share the same frequency band. For an FDD system, the downlink and uplink use different frequency bands. The wireless communications network 100 may also utilize a single carrier or multiple carriers for transmission. Each UE 120 may be equipped with a single antenna (e.g., to keep costs down) or multiple antennas (e.g., where the additional cost can be supported).

A network controller 130 (also sometimes referred to as a "system controller") may be in communication with a set of BSs 110 and provide coordination and control for these BSs 110 (e.g., via a backhaul). In certain cases (e.g., in a 5G NR system), the network controller 130 may include a centralized unit (CU) and/or a distributed unit (DU). In certain aspects, the network controller 130 may be in communication with a core network 132 (e.g., a 5G Core Network (5GC)), which provides various network functions such as Access and Mobility Management, Session Management, User Plane Function, Policy Control Function, Authentication Server Function, Unified Data Management, Application Function, Network Exposure Function, Network Repository Function, Network Slice Selection Function, etc.

In certain aspects of the present disclosure, the BSs 110 and/or the UEs 120 may include a digital-to-analog converter (DAC) circuit implementing a common-mode current removal scheme, as described in more detail herein.

Figure 2:
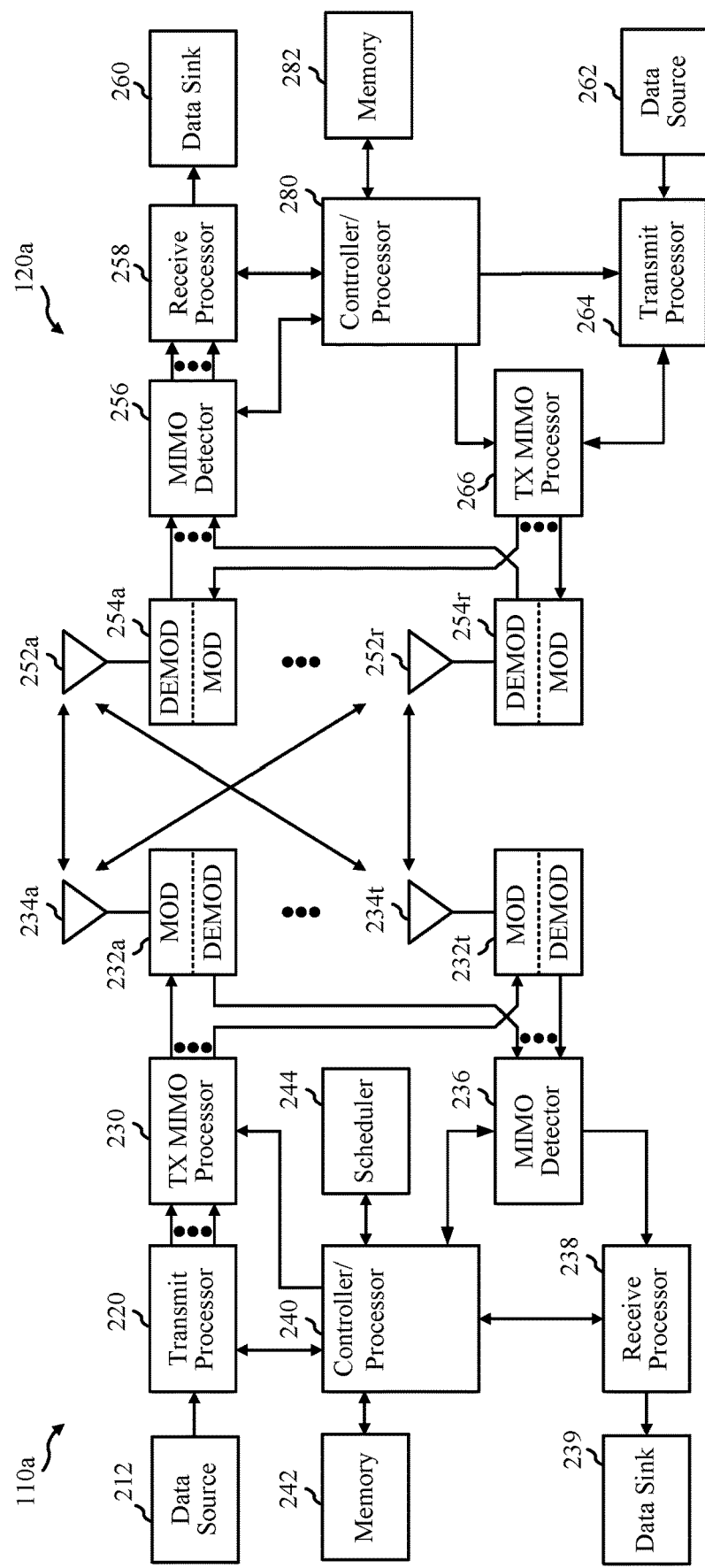
FIG. 2 is a block diagram conceptually illustrating a design of an example a base station (BS) and user equipment (UE), in which aspects of the present disclosure may be practiced.

FIG. 2 illustrates example components of BS 110a and UE 120a (e.g., from the wireless communications network 100 of FIG. 1), in which aspects of the present disclosure may be implemented.

On the downlink, at the BS 110a, a transmit processor 220 may receive data from a data source 212, control information from a controller/processor 240, and/or possibly other data (e.g., from a scheduler 244). The various types of data may be sent on different transport channels. For example, the control information may be designated for the physical broadcast channel (PBCH), physical control format indicator channel (PCFICH), physical hybrid automatic repeat request (HARM) indicator channel (PHICH), physical downlink control channel (PDCCH), group common PDCCH (GC PDCCH), etc. The data may be designated for the physical downlink shared channel (PDSCH), etc. A medium access control (MAC)-control element (MAC-CE) is a MAC layer communication structure that may be used for control command exchange between wireless nodes. The MAC-CE may be carried in a shared channel such as a PDSCH, a physical uplink shared channel (PUSCH), or a physical sidelink shared channel (PSSCH).

The processor 220 may process (e.g., encode and symbol map) the data and control information to obtain data symbols and control symbols, respectively. The transmit processor 220 may also generate reference symbols, such as for the primary synchronization signal (PSS), secondary synchronization signal (SSS), PBCH demodulation reference signal (DMRS), and channel state information reference signal (CSI-RS).

A transmit (TX) multiple-input, multiple-output (MIMO) processor 230 may perform spatial processing (e.g., precoding) on the data symbols, the control symbols, and/or the reference symbols, if applicable, and may provide output symbol streams to the modulators (MODs) in transceivers 232a-232t. Each modulator in transceivers 232a-232t may process a respective output symbol stream (e.g., for orthogonal frequency division multiplexing (OFDM), etc.) to obtain an output sample stream. Each of the transceivers 232a-232t may further process (e.g., convert to analog, amplify, filter, and upconvert) the output sample stream to obtain a downlink signal. Downlink signals from the transceivers 232a-232t may be transmitted via the antennas 234a-234t, respectively.

At the UE 120a, the antennas 252a-252r may receive the downlink signals from the BS 110a and may provide received signals to the transceivers 254a-254r, respectively. The transceivers 254a-254r may condition (e.g., filter, amplify, downconvert, and digitize) a respective received signal to obtain input samples. Each demodulator (DEMOD) in the transceivers 232a-232t may further process the input samples (e.g., for OFDM, etc.) to obtain received symbols. A MIMO detector 256 may obtain received symbols from all the demodulators in transceivers 254a-254r, perform MIMO detection on the received symbols if applicable, and provide detected symbols. A receive processor 258 may process (e.g., demodulate, deinterleave, and decode) the detected symbols, provide decoded data for the UE 120a to a data sink 260, and provide decoded control information to a controller/processor 280.

On the uplink, at UE 120a, a transmit processor 264 may receive and process data (e.g., for the physical uplink shared channel (PUSCH)) from a data source 262 and control information (e.g., for the physical uplink control channel (PUCCH)) from the controller/processor 280. The transmit processor 264 may also generate reference symbols for a reference signal (e.g., the sounding reference signal (SRS)). The symbols from the transmit processor 264 may be precoded by a TX MIMO processor 266 if applicable, further processed by the modulators (MODs) in transceivers 254a-254r (e.g., for single-carrier frequency division multiplexing (SC-FDM), etc.), and transmitted to the BS 110a. At the BS 110a, the uplink signals from the UE 120a may be received by the antennas 234, processed by the demodulators in transceivers 232a-232t, detected by a MIMO detector 236 if applicable, and further processed by a receive processor 238 to obtain decoded data and control information sent by the UE 120a. The receive processor 238 may provide the decoded data to a data sink 239 and the decoded control information to the controller/processor 240.

The memories 242 and 282 may store data and program codes for BS 110a and UE 120a, respectively. The memories 242 and 282 may also interface with the controllers/processors 240 and 280, respectively. A scheduler 244 may schedule UEs for data transmission on the downlink and/or uplink.

Antennas 252, processors 258, 264, 266, and/or controller/processor 280 of the UE 120a and/or antennas 234, processors 220, 230, 238, and/or controller/processor 240 of the BS 110a may be used to perform the various techniques and methods described herein.

In certain aspects of the present disclosure, the transceivers 232 and/or the transceivers 254 may include a digital-to-analog converter (DAC) circuit implementing a common-mode current removal scheme, as described in more detail herein.

NR may utilize orthogonal frequency division multiplexing (OFDM) with a cyclic prefix (CP) on the uplink and downlink. NR may support half-duplex operation using time division duplexing (TDD). OFDM and single-carrier frequency division multiplexing (SC-FDM) partition the system bandwidth into multiple orthogonal subcarriers, which are also commonly referred to as tones, bins, etc. Each subcarrier may be modulated with data. Modulation symbols may be sent in the frequency domain with OFDM and in the time domain with SC-FDM. The spacing between adjacent subcarriers may be fixed, and the total number of subcarriers may be dependent on the system bandwidth. The system bandwidth may also be partitioned into subbands. For example, a subband may cover multiple resource blocks (RBs).

Example RF Transceiver

Figure 3:
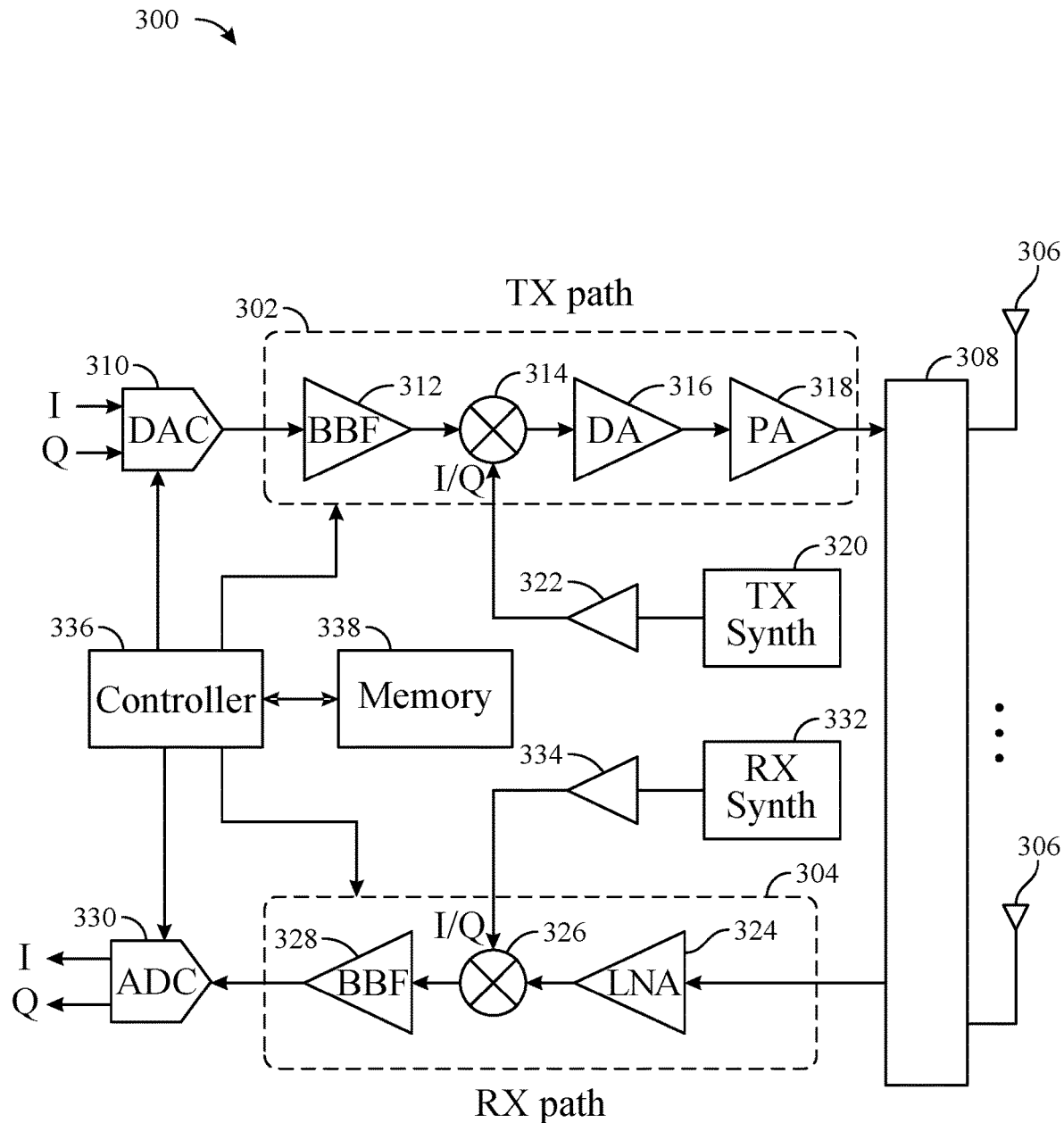
FIG. 3 is a block diagram of an example radio frequency (RF) transceiver, in which aspects of the present disclosure may be practiced.

FIG. 3 is a block diagram of an example radio frequency (RF) transceiver circuit 300, in accordance with certain aspects of the present disclosure. The RF transceiver circuit 300 includes at least one transmit (TX) path 302 (also known as a "transmit chain") for transmitting signals via one or more antennas 306 and at least one receive (RX) path 304 (also known as a "receive chain") for receiving signals via the antennas 306. When the TX path 302 and the RX path 304 share an antenna 306, the paths may be connected with the antenna via an interface 308, which may include any of various suitable RF devices, such as a switch, a duplexer, a diplexer, a multiplexer, and the like.

Receiving in-phase (I) and/or quadrature (Q) baseband analog signals from a digital-to-analog converter (DAC) 310, the TX path 302 may include a baseband filter (BBF) 312, a mixer 314, a driver amplifier (DA) 316, and a power amplifier (PA) 318. The BBF 312, the mixer 314, the DA 316, and the PA 318 may be included in a radio frequency integrated circuit (RFIC). For certain aspects, the PA 318 may be external to the RFIC.

For certain aspects, the DAC 310 may be implemented by any of various suitable high-speed DAC topologies, such as a current-steering DAC. For certain aspects, the DAC 310 may be implemented with a common-mode current removal scheme for removing common-mode current from the DAC, as described in more detail below.

The BBF 312 filters the baseband signals received from the DAC 310, and the mixer 314 mixes the filtered baseband signals with a transmit local oscillator (LO) signal to convert the baseband signal of interest to a different frequency (e.g., upconvert from baseband to a radio frequency). This frequency-conversion process produces the sum and difference frequencies between the LO frequency and the frequencies of the baseband signal of interest. The sum and difference frequencies are referred to as the "beat frequencies." The beat frequencies are typically in the RF range, such that the signals output by the mixer 314 are typically RF signals, which may be amplified by the DA 316 and/or by the PA 318 before transmission by the antenna(s) 306. While one mixer 314 is illustrated, several mixers may be used to upconvert the filtered baseband signals to one or more intermediate frequencies and to thereafter upconvert the intermediate frequency (IF) signals to a frequency for transmission.

The RX path 304 may include a low noise amplifier (LNA) 324, a mixer 326, and a baseband filter (BBF) 328. The LNA 324, the mixer 326, and the BBF 328 may be included in one or more RFICs, which may or may not be the same RFIC that includes the TX path components. RF signals received via the antenna(s) 306 may be amplified by the LNA 324, and the mixer 326 mixes the amplified RF signals with a receive local oscillator (LO) signal to convert the RF signal of interest to a different baseband frequency (e.g., downconvert). The baseband signals output by the mixer 326 may be filtered by the BBF 328 before being converted by an analog-to-digital converter (ADC) 330 to digital I and/or Q signals for digital signal processing.

Certain transceivers may employ frequency synthesizers with a variable-frequency oscillator (e.g., a voltage-controlled oscillator (VCO) or a digitally controlled oscillator (DCO)) to generate a stable, tunable LO with a particular tuning range. Thus, the transmit LO may be produced by a TX frequency synthesizer 320, which may be buffered or amplified by amplifier 322 before being mixed with the baseband signals in the mixer 314. Similarly, the receive LO may be produced by an RX frequency synthesizer 332, which may be buffered or amplified by amplifier 334 before being mixed with the RF signals in the mixer 326. For certain aspects, a single frequency synthesizer may be used for both the TX path 302 and the RX path 304. In certain aspects, the TX frequency synthesizer 320 and/or RX frequency synthesizer 332 may include a frequency multiplier, such as a frequency doubler, that is driven by an oscillator (e.g., a VCO) in the frequency synthesizer.

A controller 336 (e.g., controller/processor 280 in FIG. 2) may direct the operation of the RF transceiver circuit 300A, such as transmitting signals via the TX path 302 and/or receiving signals via the RX path 304. The controller 336 may be a processor, a digital signal processor (DSP), an application-specific integrated circuit (ASIC), a field-programmable gate array (FPGA) or other programmable logic device (PLD), discrete gate or transistor logic, discrete hardware components, or any combination thereof. A memory 338 (e.g., memory 282 in FIG. 2) may store data and/or program codes for operating the RF transceiver circuit 300. The controller 336 and/or the memory 338 may include control logic (e.g., complementary metal-oxide-semiconductor (CMOS) logic).

While FIGS. 1-3 provide wireless communications as an example application in which certain aspects of the present disclosure may be implemented to facilitate understanding, certain aspects described herein may be used for digital-to-analog conversion in any of various other suitable systems (e.g., an audio system or other electronic system).

Introduction to Digital-to-Analog Conversion Using Current Steering

Current-steering digital-to-analog converters (DACs) are one example architecture for high performance digital-to-analog conversion in many wireless transmitters. Current-steering DACs offer versatility of design, high-speed operation, and high performance (such as relatively high linearity). Although current-steering DACs are described as one example type of DAC in which aspects of the present disclosure may be implemented, it is to be understood that aspects of the present disclosure may be applied to other suitable types of DACs, as well.

Figure 4:
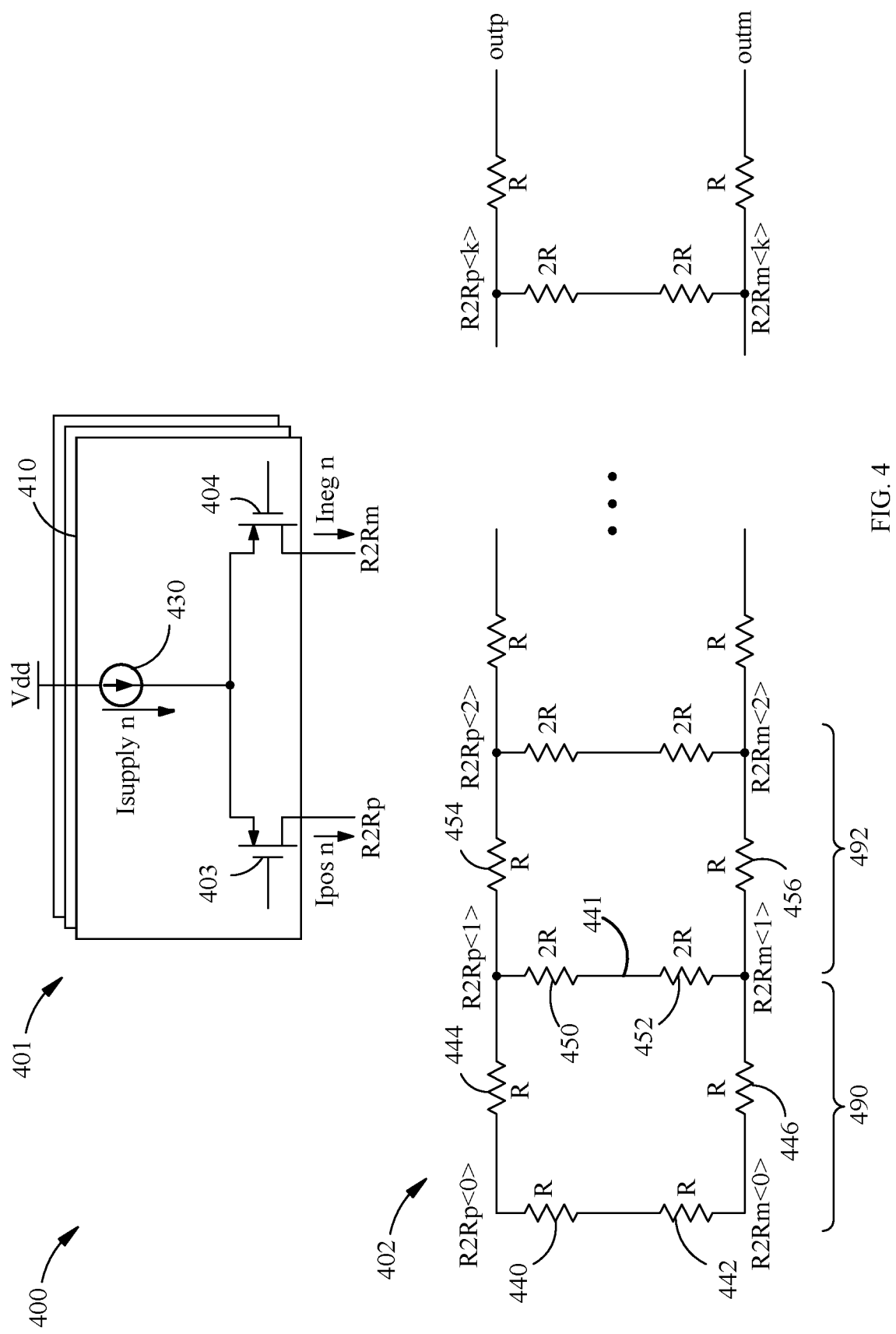
FIG. 4 is a circuit diagram of an example digital-to-analog converter (DAC), in which aspects of the present disclosure may be practiced.

FIG. 4 illustrates an example current-steering DAC 400 (e.g., which may implement the DAC 310 of FIG. 3). As shown, the current-steering DAC 400 includes current-steering cells 401 and a resistor ladder circuit 402. The resistor ladder circuit 402 may be implemented as an R-2R type ladder circuit, as explained below. For example, the resistor ladder circuit 402 may include multiple segments (e.g., segments 490, 492), each of the segments including a positive ladder node R2Rp<0> to R2Rp<k> and a negative ladder node R2Rn<0> to R2Rn<k>. Between the positive ladder node and the negative ladder node of each segment may be resistive elements (e.g., resistive elements 440, 442, or resistive elements 450, 452). Moreover, a resistive element (e.g., resistive element 444 or 454) may be coupled between the positive nodes of adjacent segments of the resistor ladder circuit 402, and a resistive element (e.g., resistive element 446 or 456) may be coupled between the negative nodes of adjacent segments of the resistor ladder circuit 402. In an R-2R ladder circuit, the series resistive elements (e.g., resistive elements 444, 454) have a value of resistance R, and shunt resistive elements (e.g., resistive elements 450, 452 in a shunt branch 441 of the ladder circuit) have double this resistance (2R), in each half of the R-2R ladder circuit. For certain aspects, the least significant bits (LSBs) may follow the R-2R ladder structure, whereas the most significant bits (MSBs) may have different resistance values in the resistor ladder circuit (e.g., according to a thermometer code).

Each of the current-steering cells 401 (e.g., current-steering cell n, n being a positive integer) includes a current source coupled to a voltage rail Vdd, a positive switch coupled to the current source and configured to selectively provide a positive current (e.g., Ipos n) to a positive ladder node, and a negative switch coupled to the current source and configured to selectively provide a negative current (e.g., Ineg n) to a negative ladder node. For example, supply current Isupply 0 (e.g., Isupply n, where n is 0) through a current source 430 may be directed via a positive switch 403 of the current-steering cell 410 to provide a positive current (e.g., Ipos 0) to the positive ladder node R2Rp<0>. Similarly, Isupply 0 through the current source 430 may alternatively be directed via a negative switch 404 to provide a negative current (e.g., Ineg 0) to the negative ladder node R2Rn<0>. In a similar manner, currents from current sources of other current-steering cells may be directed via the positive or negative switch in each current-steering cell to respective positive and negative ladder nodes (R2Rp<1> to R2Rp<k>, and R2Rm<1> to R2Rm<k>).

The control inputs to the positive switch 403 and the negative switch 404 may be complementary. In some aspects, the switches 403 and 404 may be implemented as p-type metal-oxide-semiconductor (PMOS) transistors, as illustrated. Thus, a logic high signal may be used to open switch 403 or 404, and a logic low signal may be used to close switch 403 or 404.

The output signal from the DAC 400 is in the form of a differential current at positive and negative output nodes (labeled "outp" and "outm") of the resistor ladder circuit 402. To achieve high linearity, it is desirable to remove the common-mode current from the DAC 400 (and/or elsewhere along the transmission path (e.g., TX path 302)). It may also be desirable to minimize (or at least reduce) variation of the output common-mode current with changes in process, voltage, and/or temperature (PVT), while keeping noise and offset contributions from the common-mode current removal scheme to a minimum (or at least substantially low).

In some cases, an amplifier-based common-mode feedback circuit can be used to remove some of the common-mode current. However, such a feedback circuit may be implemented with an external voltage reference (increasing area) and/or may degrade the DAC's differential noise performance and DC offset.

Alternatively, the common-mode current may be sunk through the middle of the resistor ladder circuit (e.g., to a reference potential node for the DAC, such as electrical ground) using a current source, such as a current mirror circuit, as a current sink. Such a scheme need not use a buffer and an external voltage reference, as in the amplifier-based common-mode feedback circuit.

Figure 5A:
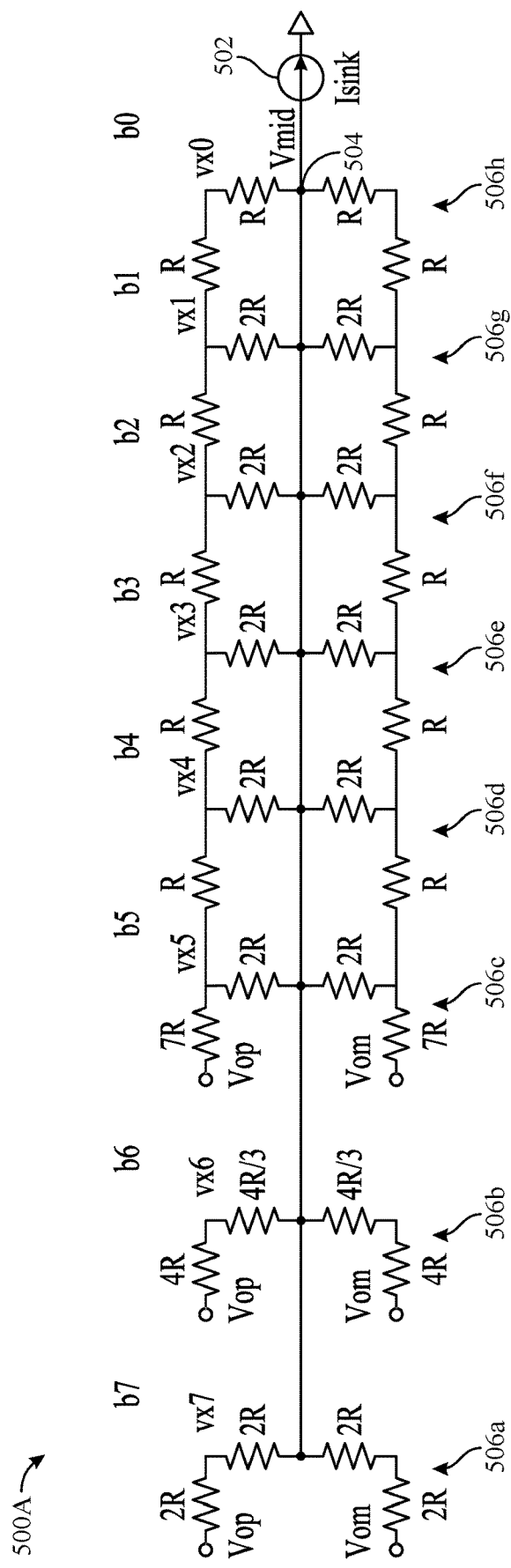
FIG. 5A is a circuit diagram of an example resistor ladder circuit coupled to a current source circuit for sinking common-mode current.

As an example, FIG. 5A is a schematic diagram of a resistor ladder circuit 500A with a current source 502 for sinking the common-mode current to electrical ground. As shown, the resistor ladder circuit 500A may have a plurality of shunt branches 506a, . . . , 506h (collectively referred to as "shunt branches 506"). The resistor ladder circuit 500A may be similar to the resistor ladder circuit 402, but with middle nodes 504 (labeled "Vmid") shorted together and coupled to the current source 502 and with shunt branches 506 associated with the various bits running from the MSB (here, bit 7, labeled "b7") on the left to the LSB (bit 0, labeled "b0") on the right, opposite the direction of the bits in the resistor ladder circuit 402 of FIG. 4. Although not shown, the resistor ladder circuit 500A may be coupled to a plurality of current-steering cells (such as current-steering cells 401), and outputs (labeled "Vop" and "Vom" for plus and minus output voltage nodes) of the resistor ladder circuit 500A may be coupled to a filter (e.g., a baseband filter, such as BBF 312).

According to some techniques, the current source 502 may sink a current Isink to remove common-mode current through the middle nodes 504 of the resistor ladder circuit 500A. The current source 502 may be programmable to change the current Isink to effectively adjust a common-mode voltage output by the resistor ladder circuit 500A (e.g., to an input of a baseband filter). However, the current source 502 may have limited headroom, which may be further limited when the equivalent resistance of the resistor ladder circuit 500A is increased. Moreover, the current source 502 may occupy a relatively large area, and may contribute to common-mode noise. In some cases, the lower the headroom, the more common-mode noise the current source 502 contributes.

Accordingly, certain aspects of the present disclosure provide common-mode current removal schemes with no headroom limitation added to the resistor ladder circuit, smaller area compared to the current mirror circuit, less thermal noise, and improved differential and common-mode noise performance. The programmability of these schemes allows for canceling, or at least reducing, process variation for the DAC. Furthermore, the common-mode current removal schemes of the present disclosure allow for increased total equivalent resistance of the resistor ladder circuit, which offers lower differential noise and less DC offset and noise gain from the baseband filter.

Example Common-Mode Current Removal Schemes for Digital-to-Analog Converters

Figure 5B:
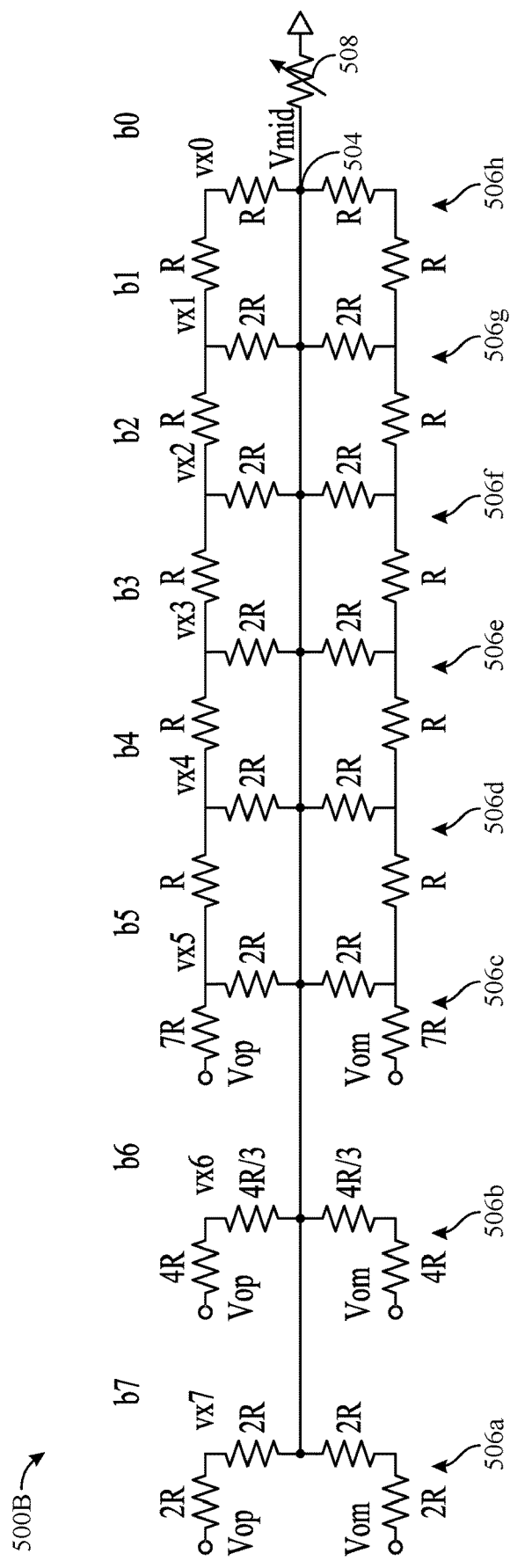
FIG. 5B is a circuit diagram of an example resistor ladder circuit coupled to an adjustable resistance circuit for sinking common-mode current, in accordance with certain aspects of the present disclosure.

FIG. 5B is a schematic diagram of an example resistor ladder circuit 500B. The resistor ladder circuit 500B may be similar to the resistor ladder circuit 500A, but with an adjustable resistance circuit 508 (as opposed to the current source 502) coupled between the middle nodes 504 and a reference potential node (e.g., electrical ground) for the resistor ladder circuit 500B (which may also be the reference potential node for a DAC circuit of which the resistor ladder circuit 500B is a part). The adjustable resistance circuit 508 may not suffer from the same headroom limitation as the current source 502, and may generate less thermal noise compared to the current source 502 (i.e., less common-mode noise). Moreover, the adjustable resistance circuit 508 may occupy a smaller total surface area (e.g., footprint) compared to the current source 502.

As shown, the resistor ladder circuit 500B may have a plurality of resistive elements, each having a resistance that is some multiple of a base unit resistance R. For certain aspects, the base unit used to determine the sizes of the resistors in the adjustable resistance circuit 508 may be the same as the base unit used to determine the sizes of the resistors in the resistor ladder circuit 500B. The maximum common-mode current will be sunk when the middle nodes 504 are shorted to ground (e.g., when the adjustable resistance circuit 508 is adjusted to have a resistance of 0).

According to certain aspects, the adjustable resistance circuit 508 may be implemented as a switched network of resistive elements (such as those illustrated in FIGS. 5C-5E, discussed in more detail below). In some aspects, the switched network of resistive elements may be a binary-weighted network of resistive elements. Switches in the switched network of resistive elements may be used to change the resistance of the adjustable resistance circuit 508 so that the common-mode current removed from the DAC circuit may be adjusted (e.g., during calibration).

Figure 5C:
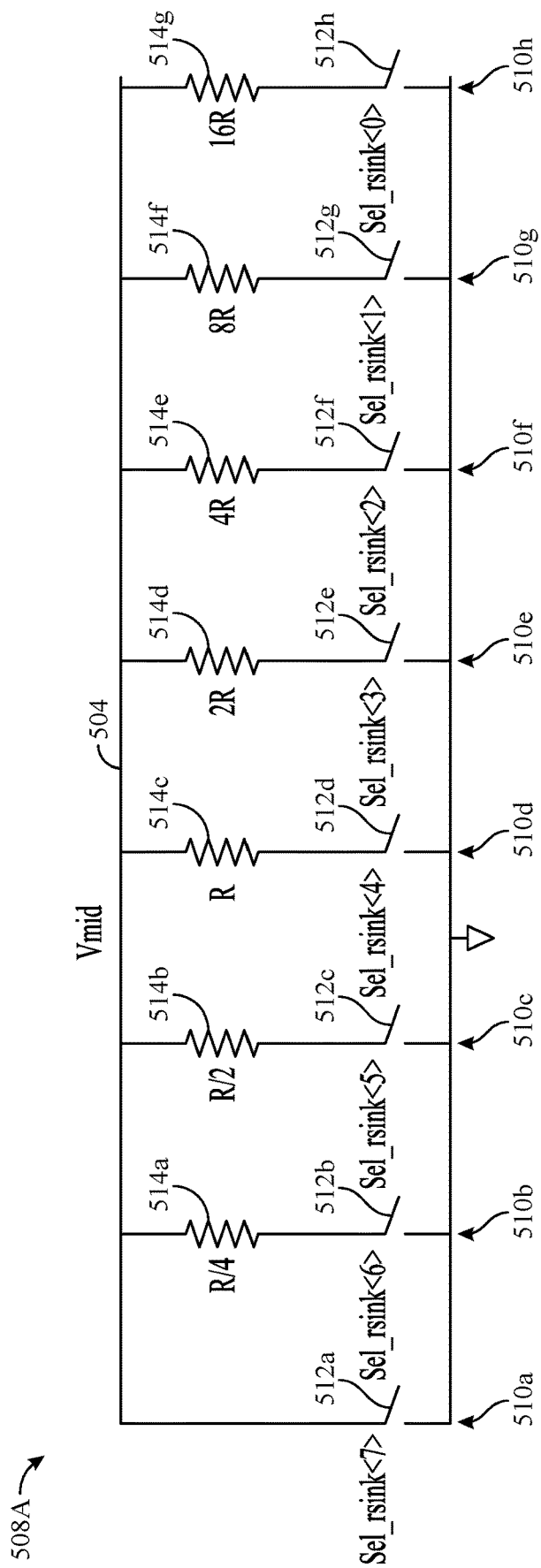
FIGS. 5C-5E illustrate example switched networks of resistive elements for implementing the adjustable resistance circuit of FIG. 5B, in accordance with certain aspects of the present disclosure.

FIG. 5C illustrates an example switched network of resistive elements 508A for implementing the adjustable resistance circuit 508.

As shown, the switched network of resistive elements 508A may include a plurality of network branches 510a, . . . , 510h (sometimes referred to individually as a "network branch 510" and collectively as "network branches 510") coupled in parallel. Although eight network branches 510 are shown, the switched network of resistive elements 508A may have more or less than eight network branches. One or more of the network branches 510 may each include a switch 512a, . . . , 512h (sometimes referred to individually as a "switch 512" and collectively as "switches 512") coupled in series with a resistive element (e.g., one of resistive elements 514a, . . . , 514g, collectively referred to as "resistive elements 514"). The switches 512 may be individually controlled via control signals labeled "Sel_r-sink<0>" to "Sel_rsink<7>." As illustrated, the resistive elements 514 may be binary weighted, running from resistance R/4 in network branch 510b to 16R in network branch 510h, in certain aspects.

For certain aspects, one of the plurality of network branches 510 (e.g., the network branch 510a) may be configured to selectively short the switched network of resistive elements 508A (e.g., shorting the middle nodes 504 to the reference potential node). Additionally or alternatively in certain aspects, another one of the plurality of network branches 510 may be configured to present a fixed resistance for the switched network of resistive elements 508A when other switches 512 in the switched network of resistive elements 508A are open.

Figure 5D:
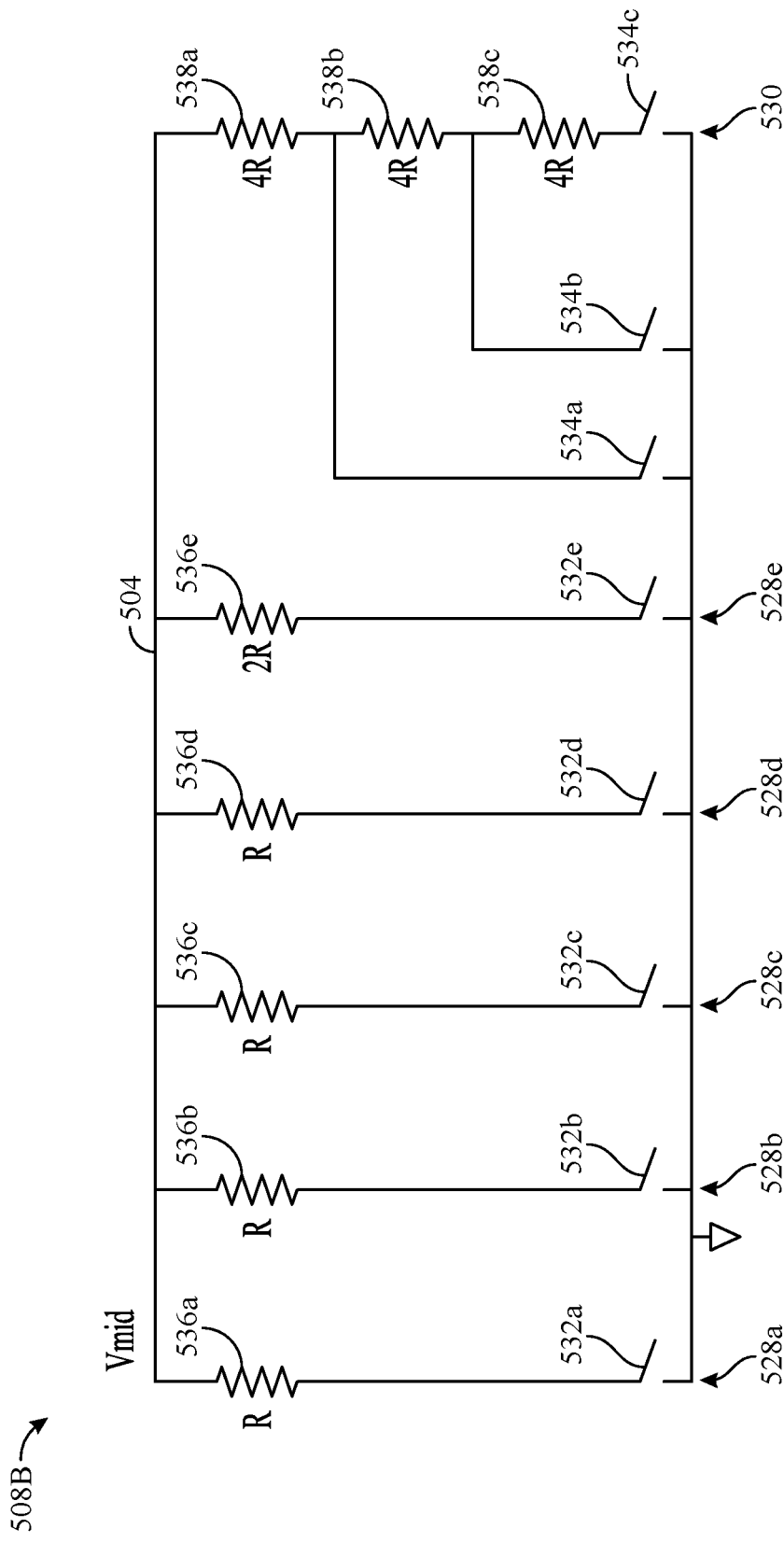

FIG. 5D illustrates another example switched network of resistive elements 508B with segmentation for implementing the adjustable resistance circuit 508. The switched network of resistive elements 508B may include a plurality of network branches 528a, . . . , 528e (collectively referred to as "network branches 528") coupled in parallel. Although five network branches 528 are shown in FIG. 5D, it is to be understood that there may be more or less than five network branches 528. As shown, one or more of the network branches 528 may each comprise a switch 532a, . . . , 532e (collectively referred to as "switches 532") coupled in series with a resistive element 536a, . . . , 536e (collectively referred to as "resistive elements 536").

One or more other network branches 530 each comprise a plurality of resistive elements 538a, . . . , 538c (collectively referred to as "resistive elements 538") selectively coupled in series via switches 534a, . . . , 534c (collectively referred to as "switches 534"). In this manner, the resistance of a network branch 530 may be effectively segmented in the switched network of resistive elements 508B. Although three resistive elements 538 are illustrated in the network branch 530 of the example switched network of resistive elements 508B of FIG. 5D, it is to be understood that a segmented network branch may include two or more than three resistive elements coupled in series. Furthermore, although a single segmented network branch 530 is shown in FIG. 5D, it is to be understood that a switched network of resistive elements may include more than one segmented network branch.

Figure 5E:
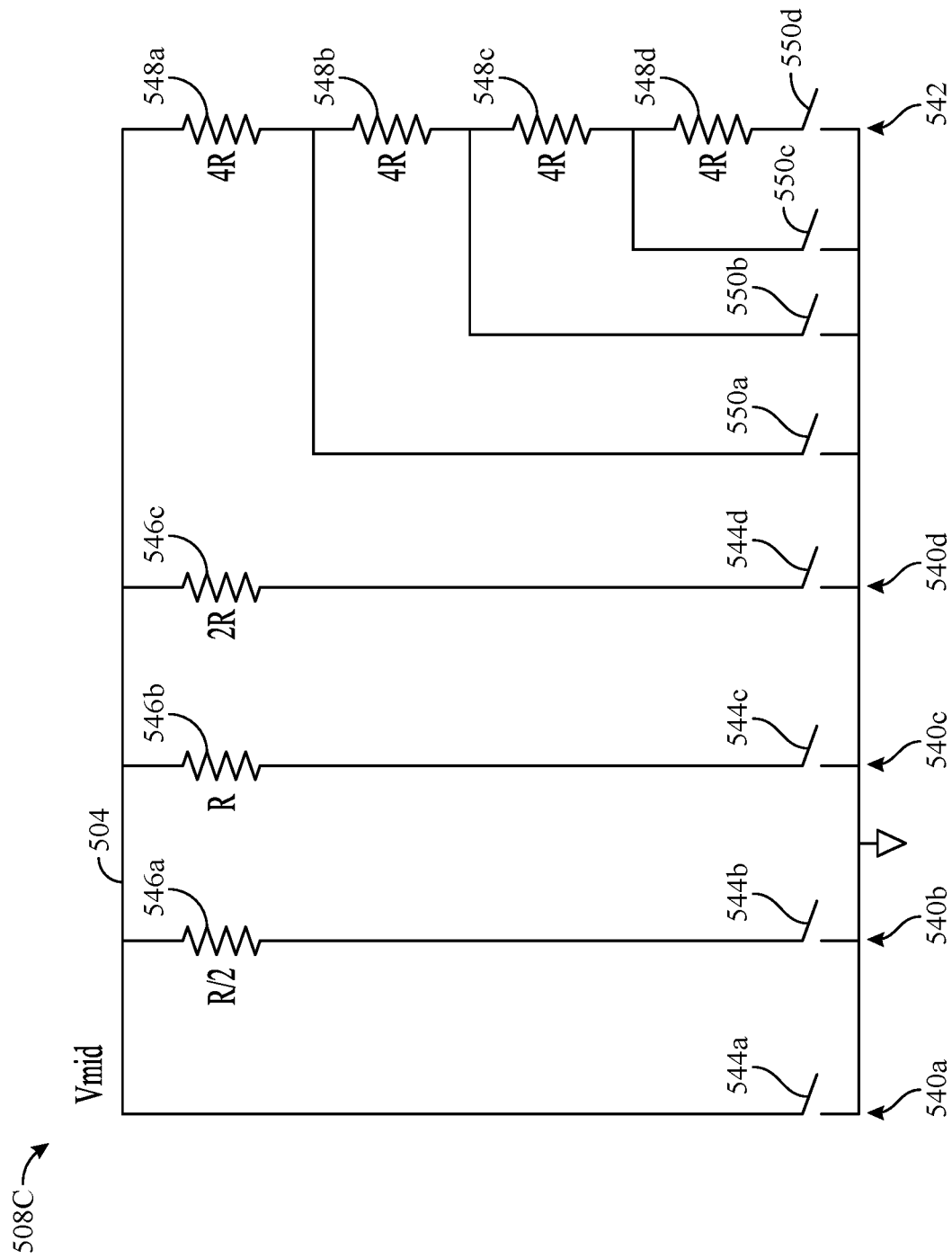

FIG. 5E illustrates yet another example switched network of resistive elements 508C for implementing the adjustable resistance circuit 508. The switched network of resistive elements 508C may be similar to the switched network of resistive elements 508B, but with fewer network branches having resistive elements coupled in parallel, and a greater number of resistive elements in a segmented network branch (e.g., a network branch having multiple resistive elements selectively coupled in series).

The switched network of resistive elements 508C may include a plurality of network branches 540a, . . . , 540d (collectively referred to as "the first set of network branches 540") coupled in parallel. Although four network branches 540 are shown in FIG. 5D, it is to be understood that there may be more or less than four network branches 540. As shown, one or more of the first set of network branches 540 may each comprise a switch 544a, . . . , 544d (collectively referred to as "switches 544") coupled in series with a resistive element 546a, . . . , 546c (collectively referred to as "resistive elements 546"). For certain aspects, one of the first set of network branches 540 (e.g., the network branch 540a) may be configured to selectively short the switched network of resistive elements 508C (e.g., shorting the middle nodes 504 to the reference potential node).

One or more other network branches 542 each comprise a plurality of resistive elements 548a, ..., 548d (collectively referred to as "resistive elements 548") selectively coupled in series via switches 550a, ..., 550d (collectively referred to as "switches 550"). Although four resistive elements 548 are illustrated in the network branch 542 of the example switched network of resistive elements 508C of FIG. 5E, it is to be understood that a segmented network branch may include two, three, or more than four resistive elements coupled in series. Furthermore, although a single segmented network branch 542 is shown in FIG. 5E, it is to be understood that a switched network of resistive elements may include more than one segmented network branch.

Figure 5F:
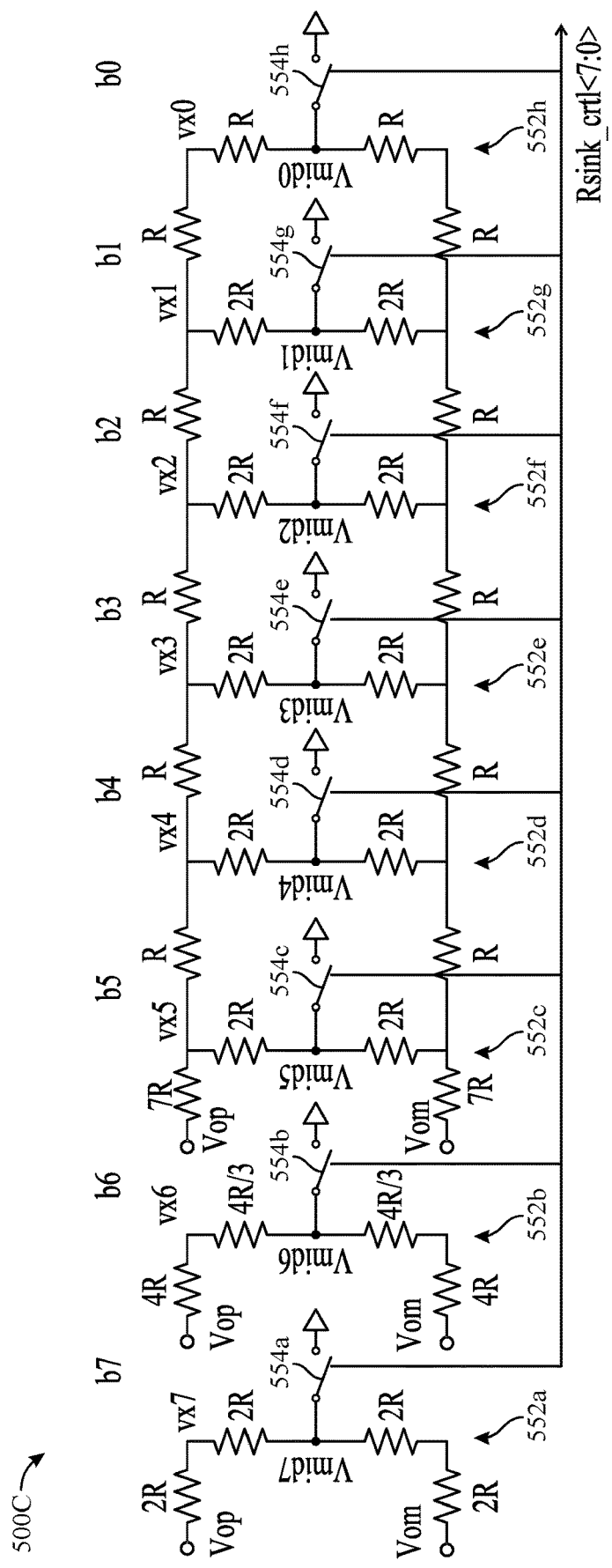
FIG. 5F is a circuit diagram of an example resistor ladder circuit with a plurality of switches for sinking common-mode current, in accordance with certain aspects of the present disclosure

FIG. 5F is a circuit diagram of an example resistor ladder circuit 500C with a plurality of switches for sinking common-mode current, in accordance with certain aspects of the present disclosure. The resistor ladder circuit 500C may have a plurality of shunt branches 552a, ..., 552h (collectively referred to as "shunt branches 552"). As shown, each switch of a plurality of switches 554a, ..., 554h (collectively referred to as "switches 554") may be coupled between a middle node (e.g., one of the nodes labeled "Vmid0, ..., Vmid7") of one of the plurality of shunt branches 552 and a reference potential node for the DAC circuit. This implementation allows the resistor ladder circuit 500C itself to be utilized as an adjustable common-mode current removal circuit (e.g., similar to the adjustable resistance circuit 508), for a more compact solution.

According to certain aspects, the plurality of switches 554 are configured to be independently controlled. This independent control may be implemented by separate control signals labeled "Rsink_ctrl<7:0>" as depicted in FIG. 5F. For other aspects, at least some of the switches 554 may be controlled by a shared control signal.

For certain aspects as shown in FIG. 5F, a number of the plurality of switches 554 may equal a number of the plurality of shunt branches 552 (i.e., each shunt branch has a switch 554 associated therewith). For other aspects, only some of the shunt branches 552 may have switches 554 associated therewith. For certain aspects, a number of the plurality of current-steering cells (e.g., the current-steering cells 401, shown in FIG. 4) may equal the number of the plurality of shunt branches 552.

Figure 5G:
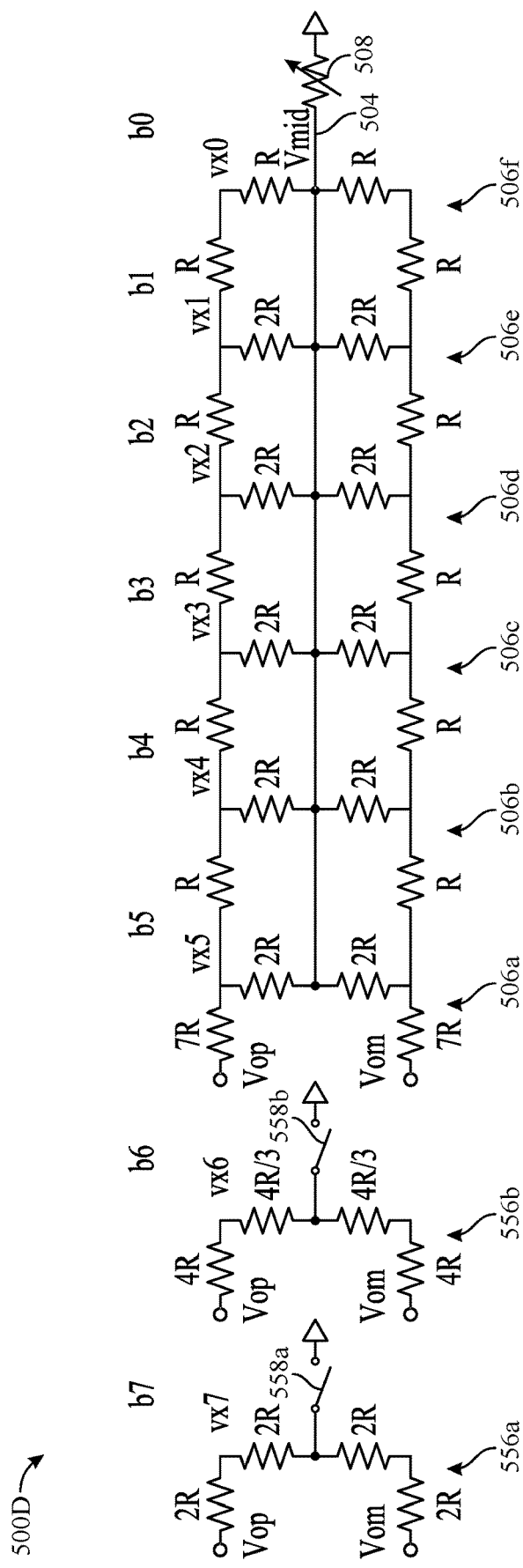
FIG. 5G is a circuit diagram of an example resistor ladder circuit with a hybrid common-mode removal circuit, in accordance with certain aspects of the present disclosure.

FIG. 5G is a circuit diagram of an example resistor ladder circuit 500D with a hybrid common-mode current removal circuit, in accordance with certain aspects of the present disclosure. The hybrid common-mode current removal circuit utilizes two different common-mode current removal schemes in the resistor ladder circuit, in which a first scheme is used for a first set of the middle nodes of the shunt branches and a second scheme is used for a second set of the middle nodes. The resistor ladder circuit 500D may be similar to the resistor ladder circuit 500B of FIG. 5B, except that the adjustable resistance circuit 508 is coupled to a first set of the middle nodes of the plurality of shunt branches (e.g., middle nodes in the shunt branches 506a to 506f), rather than to all of the middle nodes of the plurality of shunt branches. In this example, the resistor ladder circuit 500D may also include one or more switches 558a and 558b, each switch being coupled between one of a second set of the middle nodes (e.g., middle nodes in shunt branches 556a and 556b) of the plurality of shunt branches and the reference potential node for the DAC circuit. The first set of middle nodes and the second set of middle nodes may be disjoint sets. Although only two switches 558a and 558b are shown, a person of ordinary skill in the art will appreciate that a greater or fewer number of shunt branches may have a middle node coupled to a switch. Furthermore, the switch(es) coupled between the middle node(s) and the references potential node may be coupled to the middle node(s) of any of the shunt branches, and need not be coupled to the middle nodes of adjacent shunt branches.

Example Conversion Operations

FIG. 6 is a flow diagram of example operations 600 for digital-to-analog conversion with common-mode current removal in a DAC circuit (e.g., DAC 400), in accordance with certain aspects of the present disclosure. The DAC circuit generally includes a plurality of current-steering cells (e.g., the current-steering cells 401), and a resistor ladder circuit (e.g., the resistor ladder circuit 500B or 500D) coupled to the plurality of current-steering cells and having a plurality of shunt branches (e.g., shunt branches 506). The operations 600 may generally involve, at block 602, controlling an adjustable resistance circuit (e.g., the adjustable resistance circuit 508) coupled between middle nodes (e.g., middle nodes 504) of the plurality of shunt branches and a reference potential node (e.g., electrical ground) for the DAC circuit, to sink at least a portion of a common-mode current of the DAC circuit from the shunt branches of the resistor ladder circuit.

According to certain aspects, the adjustable resistance circuit may include a switched network of resistive elements (e.g., the switched network of resistive elements 508A, 508B, or 508C). In some aspects, the switched network of resistive elements may include a binary-weighted network of resistive elements. According to certain aspects, the operations 600 may further involve controlling a switch (e.g., the switch 512a or 544a) in a network branch of the binary-weighted network of resistive elements to selectively short the middle nodes of the plurality of shunt branches to the reference potential node.

According to certain aspects, the switched network of resistive elements may include a plurality of network branches (e.g., the network branches 510, 528, or 540) coupled in parallel. One or more of the network branches may each include a switch (e.g., one of the switches 512, 532, or 544) coupled in series with a resistive element (e.g., one of the resistive elements 514, 536, or 546). In this case, controlling the adjustable resistance circuit may involve selectively closing the switch in each of the one or more of the network branches. For certain aspects, the operations 600 may further involve controlling another switch (e.g., the switch 512a or 544a) in another one of the plurality of network branches (e.g., the network branch 510a or 540a) to selectively short the switched network of resistive elements. According to certain aspects, one or more other network branches (e.g., the network branches 530 or 542) may each include a plurality of resistive elements (e.g., the resistive elements 538 or 548) selectively coupled in series (e.g., via the switches 534 or 550). In this case, controlling the adjustable resistance circuit at block 602 may further involve controlling (e.g., by closing or opening particular switches 534 or 550) the effective number of the plurality of resistive elements coupled in series in each of the one or more other network branches.

In certain aspects, the middle nodes of the plurality of shunt branches may be shorted together (e.g., as shown in FIG. 5B).

For some aspects (e.g., as shown in FIG. 5G), the adjustable resistance circuit may be coupled to a first set of the middle nodes of the plurality of shunt branches (e.g., the middle nodes of shunt branches 506). According to certain aspects, the operations 600 may further involve controlling one or more switches (e.g., the switches 558a and/or 558b), each switch being coupled between one of a second set of the middle nodes of the plurality of shunt branches (e.g., the middle nodes of shunt branches 556) and the reference potential node for the DAC circuit. The first set and the second set may be disjoint sets.

FIG. 7 is a flow diagram of example operations 700 for digital-to-analog conversion with common-mode current removal in a DAC circuit (e.g. DAC 400), in accordance with certain aspects of the present disclosure. The DAC circuit generally includes a plurality of current-steering cells (e.g., the current-steering cells 401), and a resistor ladder circuit (e.g., the resistor ladder circuit 500C) coupled to the plurality of current-steering cells and having a plurality of shunt branches (e.g., the shunt branches 552). The operations 700 may generally involve, at block 702, controlling a plurality of switches (e.g., the switches 554), each switch being coupled between a middle node (e.g., one of the middle nodes Vmid0, . . . , Vmid7) of one of the plurality of shunt branches and a reference potential node (e.g., electrical ground) for the DAC circuit, to selectively sink portions of a common-mode current of the DAC circuit from the shunt branches of the resistor ladder circuit.

According to certain aspects, the controlling at block 702 may involve independently controlling at least a portion of the plurality of switches.

For certain aspects, a number of the plurality of switches may equal a number of the plurality of shunt branches. Furthermore, a number of the plurality of current-steering cells may equal the number of the plurality of shunt branches in the resistor ladder circuit.

Example Aspects

In addition to the various aspects described above, specific combinations of aspects are within the scope of the present disclosure, some of which are detailed below:

Aspect 1: A digital-to-analog converter (DAC) circuit comprising: a plurality of current-steering cells; a resistor ladder circuit coupled to the plurality of current-steering cells and having a plurality of shunt branches; and an adjustable resistance circuit coupled between middle nodes of the plurality of shunt branches and a reference potential node for the DAC circuit.

Aspect 2: The DAC circuit of Aspect 1, wherein the adjustable resistance circuit comprises a switched network of resistive elements.

Aspect 3: The DAC circuit of Aspect 2, wherein the switched network of resistive elements comprises a binary-weighted network of resistive elements.

Aspect 4: The DAC circuit of Aspect 3, wherein the binary-weighted network of resistive elements comprises a network branch configured to selectively short the middle nodes of the plurality of shunt branches to the reference potential node.

Aspect 5: The DAC circuit of Aspect 2 or 3, wherein the switched network of resistive elements comprises a plurality of network branches coupled in parallel and wherein one or more of the network branches each comprise a switch coupled in series with a resistive element.

Aspect 6: The DAC circuit of Aspect 5, wherein another one of the plurality of network branches is configured to selectively short the switched network of resistive elements.

Aspect 7: The DAC circuit of Aspect 5 or 6, wherein another one of the plurality of network branches is configured to present a fixed resistance for the switched network of resistive elements when other switches in the switched network of resistive elements are open.

Aspect 8: The DAC circuit of any of Aspects 5 to 7, wherein one or more other network branches each comprise a plurality of resistive elements selectively coupled in series.

Aspect 9: The DAC circuit of any of the preceding Aspects, wherein the middle nodes of the plurality of shunt branches are shorted together.

Aspect 10: The DAC circuit of any of Aspects 1 to 8, wherein the adjustable resistance circuit is coupled to a first set of the middle nodes of the plurality of shunt branches.

Aspect 11: The DAC circuit of Aspect 10, further comprising one or more switches, each switch being coupled between one of a second set of the middle nodes of the plurality of shunt branches and the reference potential node for the DAC circuit, wherein the first set and the second set are disjoint sets.

Aspect 12: A DAC circuit comprising: a plurality of current-steering cells; a resistor ladder circuit coupled to the plurality of current-steering cells and having a plurality of shunt branches; and a plurality of switches, each switch being coupled between a middle node of one of the plurality of shunt branches and a reference potential node for the DAC circuit.

Aspect 13: The DAC circuit of Aspect 12, wherein at least a portion of the plurality of switches are configured to be independently controlled.

Aspect 14: The DAC circuit of Aspect 12 or 13, wherein a number of the plurality of switches equals a number of the plurality of shunt branches and wherein a number of the plurality of current-steering cells equals the number of the plurality of shunt branches.

Aspect 15: A method of operating a DAC circuit comprising a plurality of current-steering cells and a resistor ladder circuit coupled to the plurality of current-steering cells and having a plurality of shunt branches, the method comprising controlling an adjustable resistance circuit coupled between middle nodes of the plurality of shunt branches and a reference potential node for the DAC circuit, to sink at least a portion of a common-mode current of the DAC circuit from the shunt branches of the resistor ladder circuit.

Aspect 16: The method of Aspect 15, wherein the adjustable resistance circuit comprises a switched network of resistive elements.

Aspect 17: The method of Aspect 16, wherein the switched network of resistive elements comprises a binary-weighted network of resistive elements.

Aspect 18: The method of Aspect 17, further comprising controlling a switch in a network branch of the binary-weighted network of resistive elements to selectively short the middle nodes of the plurality of shunt branches to the reference potential node.

Aspect 19: The method of Aspect 16 or 17, wherein the switched network of resistive elements comprises a plurality of network branches coupled in parallel, wherein one or more of the network branches each comprise a switch coupled in series with a resistive element, and wherein controlling the adjustable resistance circuit comprises selectively closing the switch in each of the one or more of the network branches.

Aspect 20: The method of Aspect 19, further comprising controlling another switch in another one of the plurality of network branches to selectively short the switched network of resistive elements.

Aspect 21: The method of Aspect 19 or 20, wherein one or more other network branches each comprise a plurality of resistive elements selectively coupled in series and wherein controlling the adjustable resistance circuit further comprises controlling an effective number of the plurality of resistive elements coupled in series in each of the one or more other network branches.

Aspect 22: The method of any of Aspects 15 to 21, wherein the middle nodes of the plurality of shunt branches are shorted together.

Aspect 23: The method of any of Aspects 15 to 21, wherein the adjustable resistance circuit is coupled to a first set of the middle nodes of the plurality of shunt branches.

Aspect 24: The method of Aspect 23, further comprising controlling one or more switches, each switch being coupled between one of a second set of the middle nodes of the plurality of shunt branches and the reference potential node for the DAC circuit, wherein the first set and the second set are disjoint sets.

Aspect 25: A method of operating a DAC circuit comprising a plurality of current-steering cells and a resistor ladder circuit coupled to the plurality of current-steering cells and having a plurality of shunt branches, the method comprising controlling a plurality of switches, each switch being coupled between a middle node of one of the plurality of shunt branches and a reference potential node for the DAC circuit, to selectively sink portions of a common-mode current of the DAC circuit from the shunt branches of the resistor ladder circuit.

Aspect 26: The method of Aspect 25, wherein the controlling comprises independently controlling at least a portion of the plurality of switches.

Aspect 27: The method of Aspect 25 or 26, wherein a number of the plurality of switches equals a number of the plurality of shunt branches and wherein a number of the plurality of current-steering cells equals the number of the plurality of shunt branches in the resistor ladder circuit.

Additional Considerations

The above description provides examples, and is not limiting of the scope, applicability, or examples set forth in the claims. Changes may be made in the function and arrangement of elements discussed without departing from the scope of the disclosure. Various examples may omit, substitute, or add various procedures or components as appropriate. For instance, the methods described may be performed in an order different from that described, and various steps may be added, omitted, or combined. Also, features described with respect to some examples may be combined in some other examples. For example, an apparatus may be implemented or a method may be practiced using any number of the aspects set forth herein. In addition, the scope of the disclosure is intended to cover such an apparatus or method which is practiced using other structure, functionality, or structure and functionality in addition to, or other than, the various aspects of the disclosure set forth herein. It should be understood that any aspect of the disclosure disclosed herein may be embodied by one or more elements of a claim. The word "exemplary" is used herein to mean "serving as an example, instance, or illustration." Any aspect described herein as "exemplary" is not necessarily to be construed as preferred or advantageous over other aspects.

The various operations of methods described above may be performed by any suitable means capable of performing the corresponding functions. The means may include various hardware and/or software component(s) and/or module (s), including, but not limited to a circuit, an application-specific integrated circuit (ASIC), or processor. Generally, where there are operations illustrated in figures, those operations may have corresponding counterpart means-plus-function components.

As used herein, a phrase referring to "at least one of" a list of items refers to any combination of those items, including single members. As an example, "at least one of: a, b, or c" is intended to cover: a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c).

The methods disclosed herein comprise one or more steps or actions for achieving the described method. The method steps and/or actions may be interchanged with one another without departing from the scope of the claims. In other words, unless a specific order of steps or actions is specified, the order and/or use of specific steps and/or actions may be modified without departing from the scope of the claims.

It is to be understood that the claims are not limited to the precise configuration and components illustrated above. Various modifications, changes, and variations may be made in the arrangement, operation, and details of the methods and apparatus described above without departing from the scope of the claims.

The invention claimed is:

1. A digital-to-analog converter (DAC) circuit comprising:
a plurality of current-steering cells;
a resistor ladder circuit coupled to the plurality of current-steering cells and having a plurality of shunt branches; and
an adjustable resistance circuit coupled between middle nodes of the plurality of shunt branches and a reference potential node for the DAC circuit, wherein the adjustable resistance circuit comprises a switched network of resistive elements.

2. The DAC circuit of claim 1, wherein the switched network of resistive elements comprises a binary-weighted network of resistive elements.

3. The DAC circuit of claim 2, wherein the binary-weighted network of resistive elements comprises a network branch configured to selectively short the middle nodes of the plurality of shunt branches to the reference potential node.

4. The DAC circuit of claim 1, wherein the switched network of resistive elements comprises a plurality of network branches coupled in parallel and wherein one or more of the network branches each comprise a switch coupled in series with a resistive element.

5. The DAC circuit of claim 4, wherein another one of the plurality of network branches is configured to selectively short the switched network of resistive elements.

6. The DAC circuit of claim 4, wherein another one of the plurality of network branches is configured to present a fixed resistance for the switched network of resistive elements when other switches in the switched network of resistive elements are open.

7. The DAC circuit of claim 4, wherein one or more other network branches each comprise a plurality of resistive elements selectively coupled in series.

8. The DAC circuit of claim 1, wherein the middle nodes of the plurality of shunt branches are shorted together.

9. The DAC circuit of claim 1, wherein the adjustable resistance circuit is coupled to a first set of the middle nodes of the plurality of shunt branches.

10. The DAC circuit of claim 9, further comprising one or more switches, each switch being coupled between one of a second set of the middle nodes of the plurality of shunt branches and the reference potential node for the DAC circuit, wherein the first set and the second set are disjoint sets.

11. A digital-to-analog converter (DAC) circuit comprising:
  a plurality of current-steering cells;
  a resistor ladder circuit coupled to the plurality of current-steering cells and having a plurality of shunt branches; and
  a plurality of switches, each switch being coupled between a middle node of one of the plurality of shunt branches and a reference potential node for the DAC circuit.

12. The DAC circuit of claim 11, wherein at least a portion of the plurality of switches are configured to be independently controlled.

13. The DAC circuit of claim 11, wherein a number of the plurality of switches equals a number of the plurality of shunt branches and wherein a number of the plurality of current-steering cells equals the number of the plurality of shunt branches.

14. The DAC circuit of claim 11, wherein the reference potential node comprises electrical ground.

15. A method of operating a digital-to-analog converter (DAC) circuit comprising a plurality of current-steering cells and a resistor ladder circuit coupled to the plurality of current-steering cells and having a plurality of shunt branches, the method comprising controlling an adjustable resistance circuit coupled between middle nodes of the plurality of shunt branches and a reference potential node for the DAC circuit, to sink at least a portion of a common-mode current of the DAC circuit from the shunt branches of the resistor ladder circuit, wherein the adjustable resistance circuit comprises a switched network of resistive elements.

16. The method of claim 15, wherein the switched network of resistive elements comprises a binary-weighted network of resistive elements.

17. The method of claim 16, further comprising controlling a switch in a network branch of the binary-weighted network of resistive elements to selectively short the middle nodes of the plurality of shunt branches to the reference potential node.

18. The method of claim 15, wherein the switched network of resistive elements comprises a plurality of network branches coupled in parallel, wherein one or more of the network branches each comprise a switch coupled in series with a resistive element, and wherein controlling the adjustable resistance circuit comprises selectively closing the switch in each of the one or more of the network branches.

19. The method of claim 18, further comprising controlling another switch in another one of the plurality of network branches to selectively short the switched network of resistive elements.

20. The method of claim 18, wherein one or more other network branches each comprise a plurality of resistive elements selectively coupled in series and wherein controlling the adjustable resistance circuit further comprises controlling an effective number of the plurality of resistive elements coupled in series in each of the one or more other network branches.

21. The method of claim 15, wherein the middle nodes of the plurality of shunt branches are shorted together.

22. The method of claim 15, wherein the adjustable resistance circuit is coupled to a first set of the middle nodes of the plurality of shunt branches.

23. The method of claim 22, further comprising controlling one or more switches, each switch being coupled between one of a second set of the middle nodes of the plurality of shunt branches and the reference potential node for the DAC circuit, wherein the first set and the second set are disjoint sets.

24. A method of operating a digital-to-analog converter (DAC) circuit comprising a plurality of current-steering cells and a resistor ladder circuit coupled to the plurality of current-steering cells and having a plurality of shunt branches, the method comprising controlling a plurality of switches, each switch being coupled between a middle node of one of the plurality of shunt branches and a reference potential node for the DAC circuit, to selectively sink portions of a common-mode current of the DAC circuit from the shunt branches of the resistor ladder circuit.

25. The method of claim 24, wherein the controlling comprises independently controlling at least a portion of the plurality of switches.

26. The method of claim 24, wherein a number of the plurality of switches equals a number of the plurality of shunt branches and wherein a number of the plurality of current-steering cells equals the number of the plurality of shunt branches in the resistor ladder circuit.

* * * * *